United States Patent
Sastry et al.

(10) Patent No.: US 9,831,664 B1
(45) Date of Patent: Nov. 28, 2017

(54) INTEGRATED CIRCUIT BREAKER PANELS

(71) Applicant: Google Inc., Mountain View, CA (US)

(72) Inventors: Jyoti Sastry, San Jose, CA (US); Anand Ramesh, Sunnyvale, CA (US); James C. Schmalzried, San Jose, CA (US); Ankit Somani, Sunnyvale, CA (US); Ryan T. Davis, Mountain View, CA (US)

(73) Assignee: Google Inc., Mountain View, CA (US)

( * ) Notice: Subject to any disclaimer, the term of this patent is extended or adjusted under 35 U.S.C. 154(b) by 401 days.

(21) Appl. No.: 14/705,538

(22) Filed: May 6, 2015

Related U.S. Application Data

(60) Provisional application No. 61/989,273, filed on May 6, 2014.

(51) Int. Cl.
  *H02H 7/26* (2006.01)
  *H02H 9/02* (2006.01)
  *G01R 21/00* (2006.01)

(52) U.S. Cl.
  CPC .............. *H02H 9/02* (2013.01); *G01R 21/00* (2013.01); *H02H 7/26* (2013.01)

(58) Field of Classification Search
  CPC ............. H02H 7/26; H02H 9/02; G01R 21/00
  USPC ....................................... 361/93.1
  See application file for complete search history.

(56) References Cited

U.S. PATENT DOCUMENTS

| | | | |
|---|---|---|---|
| 4,780,872 A * | 10/1988 | Masuda | H04Q 9/14 340/9.15 |
| 6,777,627 B1 | 8/2004 | Stevenson | |
| 7,706,927 B2 | 4/2010 | Naumann et al. | |
| 8,310,370 B1 | 11/2012 | Williams et al. | |
| 8,350,417 B1 | 1/2013 | Dooley et al. | |
| 8,488,302 B2 | 7/2013 | Mills et al. | |
| 8,532,265 B2 | 9/2013 | Wright et al. | |
| 8,649,987 B2 | 2/2014 | Steenberg et al. | |
| 2007/0103835 A1 | 5/2007 | Sorenson | |
| 2007/0222295 A1* | 9/2007 | Wareham | H02J 3/14 307/32 |
| 2011/0209136 A1* | 8/2011 | Sims | G06F 8/65 717/171 |
| 2012/0300348 A1 | 11/2012 | Franks et al. | |

* cited by examiner

*Primary Examiner* — Scott Bauer
*Assistant Examiner* — Kevin J Comber
(74) *Attorney, Agent, or Firm* — Fish & Richardson P.C.

(57) ABSTRACT

Circuit breaker panels for use in, e.g., residential and light commercial applications. The circuit breaker panels are configured to perform conventional safety functions and are also configured for remote control and monitoring. The circuit breaker panels can be constructed with remote control and monitoring capability, and circuit breaker panels lacking remote control and monitoring capability can be augmented to include remote control and monitoring capability.

18 Claims, 12 Drawing Sheets

INTEGRATED CIRCUIT BREAKER PANELS

CROSS-REFERENCE TO RELATED APPLICATIONS

This nonprovisional patent application claims the benefit of priority to U.S. Provisional Application No. 61/989,273, filed on May 6, 2014, the disclosure of which is expressly incorporated herein by reference in its entirety.

BACKGROUND

This specification relates to circuit breaker panels.

Circuit breakers in some residential applications are implemented using mechanical breakers with thermal and magnetic detection methods. Circuit breakers are typically used to protect against overcurrent conditions and typically respond in a few alternating current (AC) cycles by tripping and breaking the circuit. For example, circuit breakers for a residence can be housed in a panel that provides convenient access to a resident for all or most of the breakers in the house.

SUMMARY

This specification describes integrated circuit breaker panels for use in, e.g., residential and light commercial applications. The circuit breaker panels are configured to perform conventional safety functions and are also configured for remote control and monitoring.

In general, one innovative aspect of the subject matter described in this specification can be embodied in an electrical panel comprising: a housing comprising an input for coupling to an electrical grid and a plurality of outputs for coupling to a plurality of branch circuits; a pair of parallel bus bars connected to the housing, defining a space between the bus bars; a plurality of circuit breakers inside the housing, one for each branch circuit, wherein each circuit breaker is configured to provide overcurrent protection for the circuit breaker's branch circuit, and wherein each circuit breaker is coupled to one of the bus bars and extends from the bus bar into the space between the bus bars; a plurality of remote operability devices inside the housing, one for each circuit breaker, wherein each remote operability device is coupled in series with a respective circuit breaker; and a control system coupled to each of the remote operability devices and configured to individually control each of the remote operability devices The foregoing and other embodiments can each optionally include one or more of the following features, alone or in combination. The electrical panel can include a printed circuit board inside the housing, wherein a first plurality of circuit breakers are organized into a first column over the printed circuit board, and wherein the respective remote operability device of each of the first plurality of circuit breakers is mounted on the printed circuit board in a second column parallel to the first column, so that each circuit breaker of the first plurality of circuit breakers forms a row with the circuit breaker's respective remote operability device. The electrical panel can include a plurality of additional electrical components mounted on the printed circuit board underneath the circuit breakers. The electrical panel of claim can include a plurality of monitoring circuits, at least one for each branch circuit, each monitoring circuit being coupled in series with a respective remote operability device and a respective circuit breaker, each monitoring circuit being configured to monitor at least one aspect of the power drawn by the monitoring circuit's respective branch circuit. The control system is coupled to each of the monitoring circuits and is configured to receive and store monitoring information from each of the monitoring circuits. The control system comprises a communications module configured to communicate on a data communications network, and wherein the control system is coupled to each of the monitoring circuits and is configured to receive respective monitoring information from each of the monitoring circuits and report the monitoring information to a remote computer system over the data communications network.

In general, one innovative aspect of the subject matter described in this specification can be embodied in a method for augmenting an electrical panel comprising a housing and a plurality of circuit breakers inside the housing, one for each of a plurality of branch circuits, wherein each circuit breaker is configured to provide overcurrent protection for the circuit breaker's branch circuit, the method comprising: installing a plurality of remote operability devices for the electrical panel, one remote operability device for each branch circuit of a subset of the plurality of branch circuits, including coupling each remote operability device in series with a respective circuit breaker; installing a plurality of monitoring circuits for the electrical panel, one for each branch circuit of the subset of the plurality of branch circuits, including coupling each monitoring circuit in series with a respective circuit breaker, each monitoring circuit being configured to monitor at least one aspect of the power drawn by the monitoring circuit's respective branch circuit; and installing a control system for the electrical panel, including coupling the control system to each of the remote operability devices and each of the monitoring circuits so that the control system is configured to individually control each of the remote operability devices and receive respective monitoring information from each of the monitoring circuits.

The foregoing and other embodiments can each optionally include one or more of the following features, alone or in combination. Installing the remote operability devices comprises: installing a DIN rail; and installing at least a first plurality of remote operability devices in parallel along the DIN rail. Installing the remote operability devices comprises installing at least a first plurality of remote operability devices by wiring the remote operability devices to respective circuit breakers without physically attaching the remote operability devices to the housing. Installing the remote operability devices comprises installing at least a first plurality of remote operability devices on the outside of the housing. The housing comprises a plurality of knockouts, and wherein installing the first plurality of remote operability devices on the outside of the housing comprises wiring the remote operability devices through the knockouts. The control system comprises a communications module configured to communicate over a data communications network, and wherein installing the control system comprises configuring the control system to report the monitoring information to a remote computer system over the data communications network In general, one innovative aspect of the subject matter described in this specification can be embodied in a system comprising: an electrical panel comprising a housing and a plurality of circuit breakers inside the housing, one for each of a plurality of branch circuits, wherein each circuit breaker is configured to provide overcurrent protection for the circuit breaker's respective branch circuit; an add-on panel comprising: a plurality of remote operability devices, at least one for each branch circuit, wherein each remote operability device in the add-on panel is coupled in series with a respective circuit breaker in the electrical panel; and a plurality of monitoring circuits, one for each branch circuit, wherein each monitoring circuit in the add-on panel is coupled in series with a respective circuit breaker, each monitoring circuit being configured to monitor at least one aspect of the power drawn by the monitoring circuit's respective branch circuit; a control system coupled to the add-on panel and configured to individually control each of the remote operability devices and receive respective monitoring information from each of the monitoring circuits.

The foregoing and other embodiments can each optionally include one or more of the following features, alone or in combination. The control system comprises a communications module configured to communicate on a data communications network. The control system is configured to report the monitoring information to a remote computer system over the data communications network. The control system is configured to receive one or more instructions from a remote computer system over the data communications network and, in response, control one or more of the remote operability devices using the instructions. The system includes an additional add-on panel, wherein the add-on panel is coupled to the additional add-on panel by a communications link, and wherein the control system is configured to send one or more instructions to the additional add-on panel by sending the instructions to the add-on panel which, in turn, remote operability devices the instructions to the additional add-on panel over the communications link. The add-on panel comprises a microcontroller configured, by executing communications software, to relay the instructions over the communications link using a data communications network, and wherein the electrical panel and the additional electrical panel are in a master/slave relationship.

Particular embodiments of the subject matter described in this specification can be implemented to realize one or more advantages. An electrical panel can perform remote control and monitoring of branch circuits. The electrical panel can include a communications module which can be used to receive instructions for remote control and to send monitoring information. A conventional electrical panel can be augmented with devices for remote control and monitoring, which can reduce costs and improve certification speed. A conventional panel can be combined with an add-on panel, which can improve installation speed and reduce installation complexity.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTIONS OF DRAWINGS

Like reference numbers and designations in the various drawings indicate like elements.

DETAILED DESCRIPTION

Figure 1:
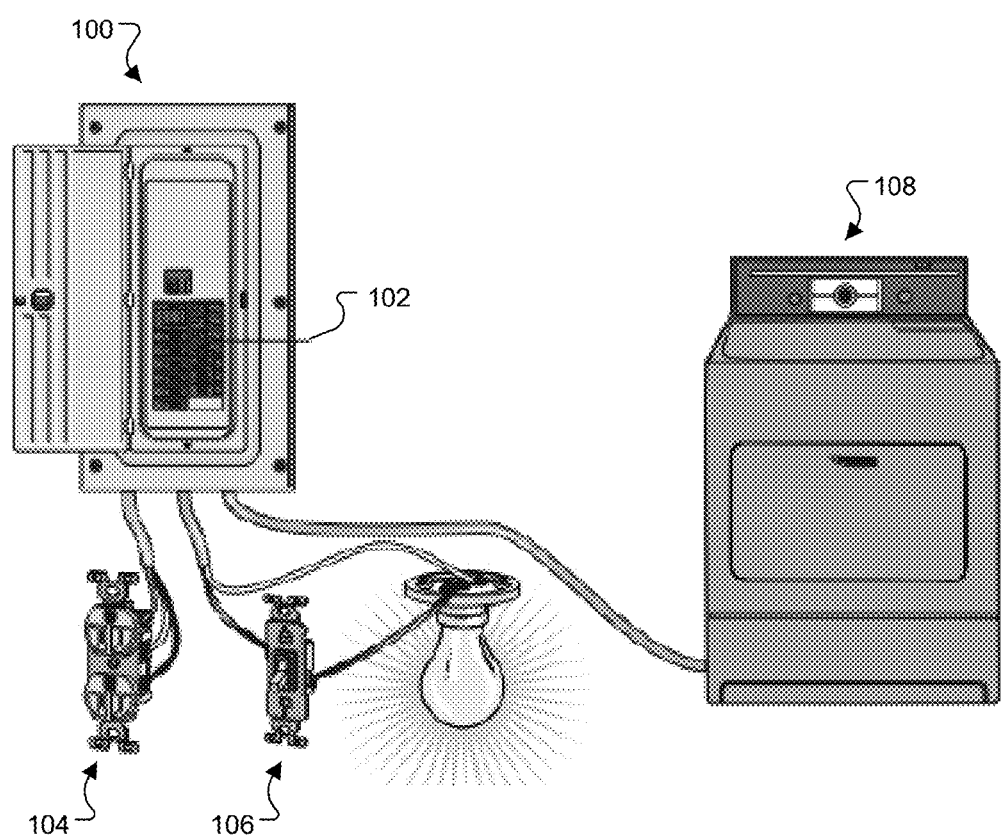
FIG. 1 is a block diagram of an example electrical panel.

FIG. 1 is a block diagram of an example electrical panel 100. The panel can be used to distribute electricity in various electrical systems, e.g., residential electrical systems and light commercial electrical systems.

The panel includes a housing and multiple branch circuit breakers 102 inside the housing. A circuit breaker is a device that can energize or de-energize a circuit. Circuit breakers can provide personal and equipment protection by detecting faults and conditions that could otherwise result in electrocutions or fires or both. The example panel of FIG. 1 can include various types of circuit breakers, e.g., circuit breakers as described further below with reference to FIGS. 3-4, 5A-B, 6, and 7.

The panel can be wired in a tree-like structure, where a single breaker, e.g., a main circuit breaker, is used to isolate a residence or other electrical system from a distribution transformer. In some implementations, additional levels of protection are added, e.g., by installing main circuit breakers at additional points, e.g., at the transformer and again at the point of entry at the residence and again at the point of entry at the panel. The main circuit breaker is typically rated to handle high short-circuit interrupting currents.

The panel distributes power to a number of downstream electrical circuits 104, 106, 108. The branch circuit breakers can have a lower short-circuit current rating than the main circuit breaker. In some implementations, the main circuit breaker and the branch circuit breakers are implemented with different time-current ("trip") curves to enable coordinating tripping of breakers within the electrical system.

For example, this can enable the tripping of a branch circuit breaker as a first line of protection, thereby isolating only small sections of the circuit, and then later tripping of the main circuit breaker in the event of a failure of operation of the branch circuit breaker. The main and branch circuit breakers can be configured to use trip curves to confine protection zones within a home at the level of a single large load or multiple small loads, instead of the entire residence.

Figure 2A:
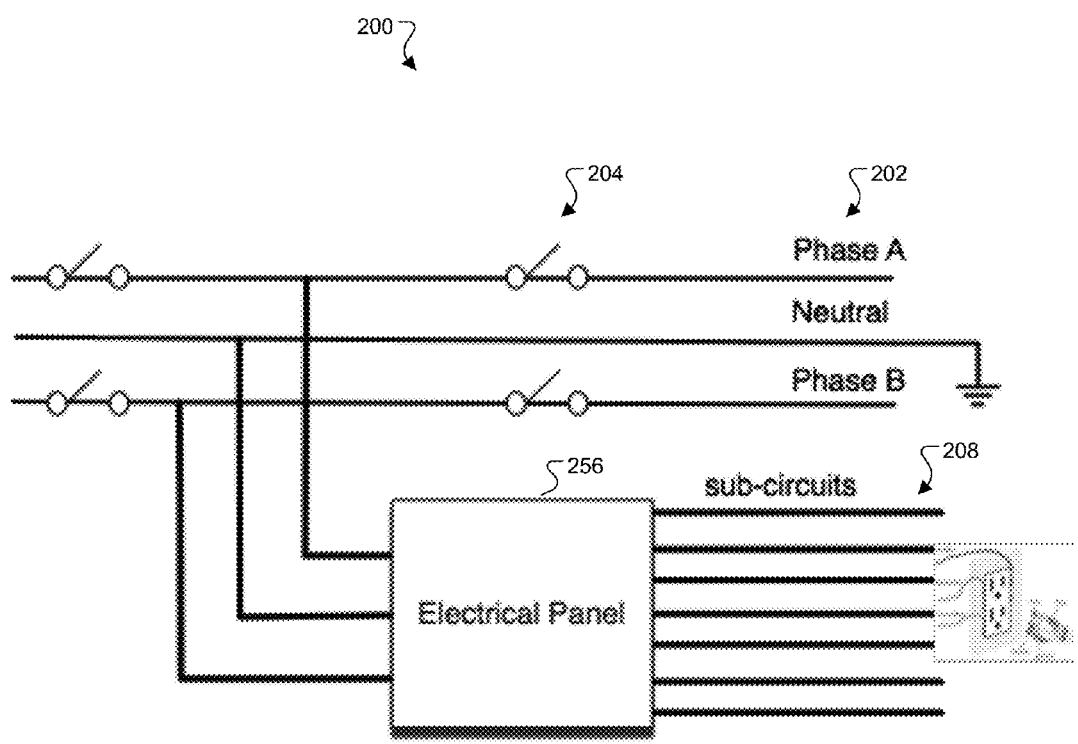
FIG. 2A is a block diagram of an example split-phase electrical system with two phases and a grounded neutral.

FIG. 2A is a block diagram of an example split-phase electrical system 200 with two phases and a grounded neutral. The system receives split-phase power on three electrical connections 202, e.g., from a utility grid. A main circuit breaker 204 is coupled between the source of the split-phase power and an electrical panel 256, which is described in more detail in FIG. 2B. The electrical panel includes multiple branch circuit breakers and is configured to distribute power to a number of downstream circuit branches 208.

Figure 2B:
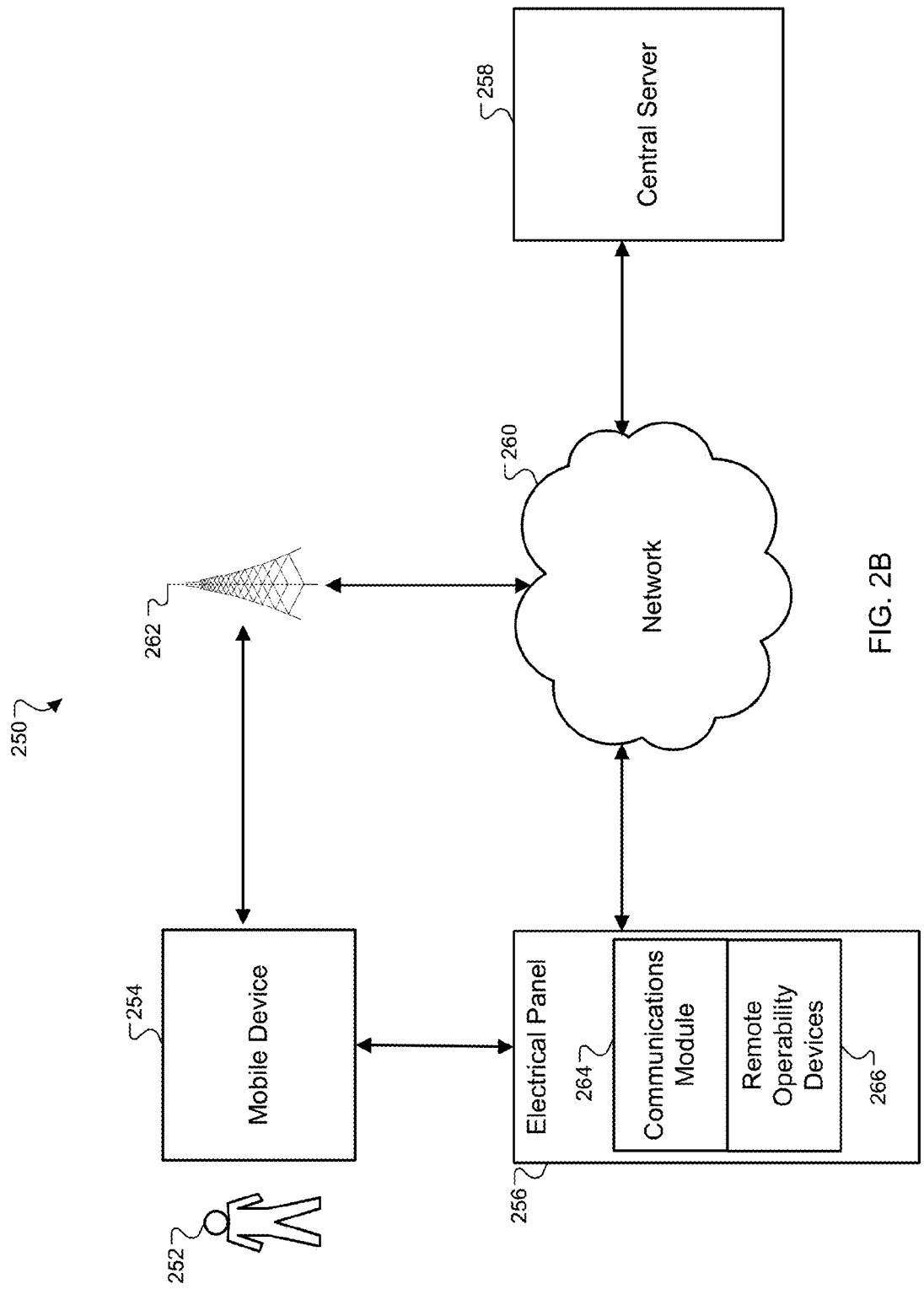
FIG. 2B is a block diagram of an example system for communications with an example electrical panel.

FIG. 2B is a block diagram of an example system 250 for communications with an example electrical panel 256. The electrical panel includes a communications module 264 configured to communicate on one or more data communications networks. A user 252 interacts with a mobile device 254 configured to display a user interface for controlling and/or monitoring the electrical panel. Although the mobile device 254 is illustrated, the user can interact with any appropriate computing device, e.g., a laptop or desktop computer.

The mobile device can communicate directly with the panel, e.g., using WiFi direct, or indirectly, e.g., using a cellular network 262 connected to a data communications network 260, e.g., the Internet, connected to the panel. In some implementations, the mobile device communicates with a central server 258 connected to the network, and the central server then communicates with the panel. In some examples, the mobile device can communicate with a local computing device that is connected to the panel, where the local computing device can facilitate control of the electrical panel. In some examples, the local computing device can also be connected to the data communications network 260.

For example, suppose that the central server is configured to host an energy management service for various users. The user establishes an account with the central server and configures the panel to send monitoring information to the central server. The user can then log in to the account at the central server using the mobile device and view the monitoring information, e.g., an amount of power used by a number of loads over a period of time. The user can also log in to the account and remotely control the panel.

The electrical panel includes one or more remote operability devices 266. A remote operability device is a device configured to be controlled by instructions from the communications module 264. A remote operability device is an electronic device configured to perform remote control and/or monitoring of a branch circuit. For example, the remote operability device can be a relay, or a relay in combination with a monitoring circuit, e.g., a current shunt or a voltage sensor. For example, a remote operability device adjust the amount of power drawn by a load, e.g., by tripping a circuit breaker switch. In some examples, the remote operability devices 266 are modular.

Figure 3A:
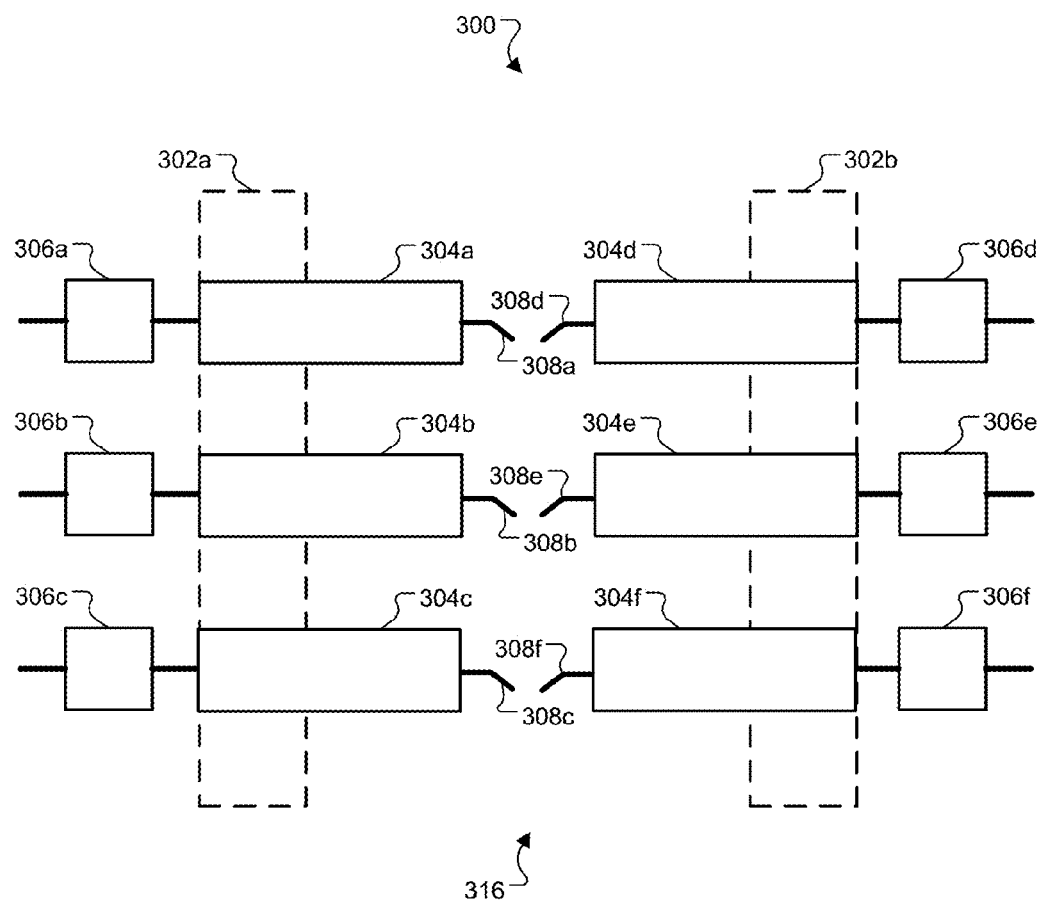
FIG. 3A is a top view of the layout of the inside an example electrical panel.

FIG. 3A is a top view of the layout of the inside an example electrical panel 300. The panel includes two parallel bus bars 302a-b and a number of circuit breakers 304a-f coupled to the bus bars. The circuit breakers are configured, e.g., using thermal and magnetic detection, to provide overcurrent protection to branch circuits. The panel also includes a number of relays 306a-f, one for each circuit breaker. Each relay is coupled in series with a respective circuit breaker. In some examples, the electrical panel 300 is coupled to another electrical panel that is exclusive of relays.

Figure 3B:
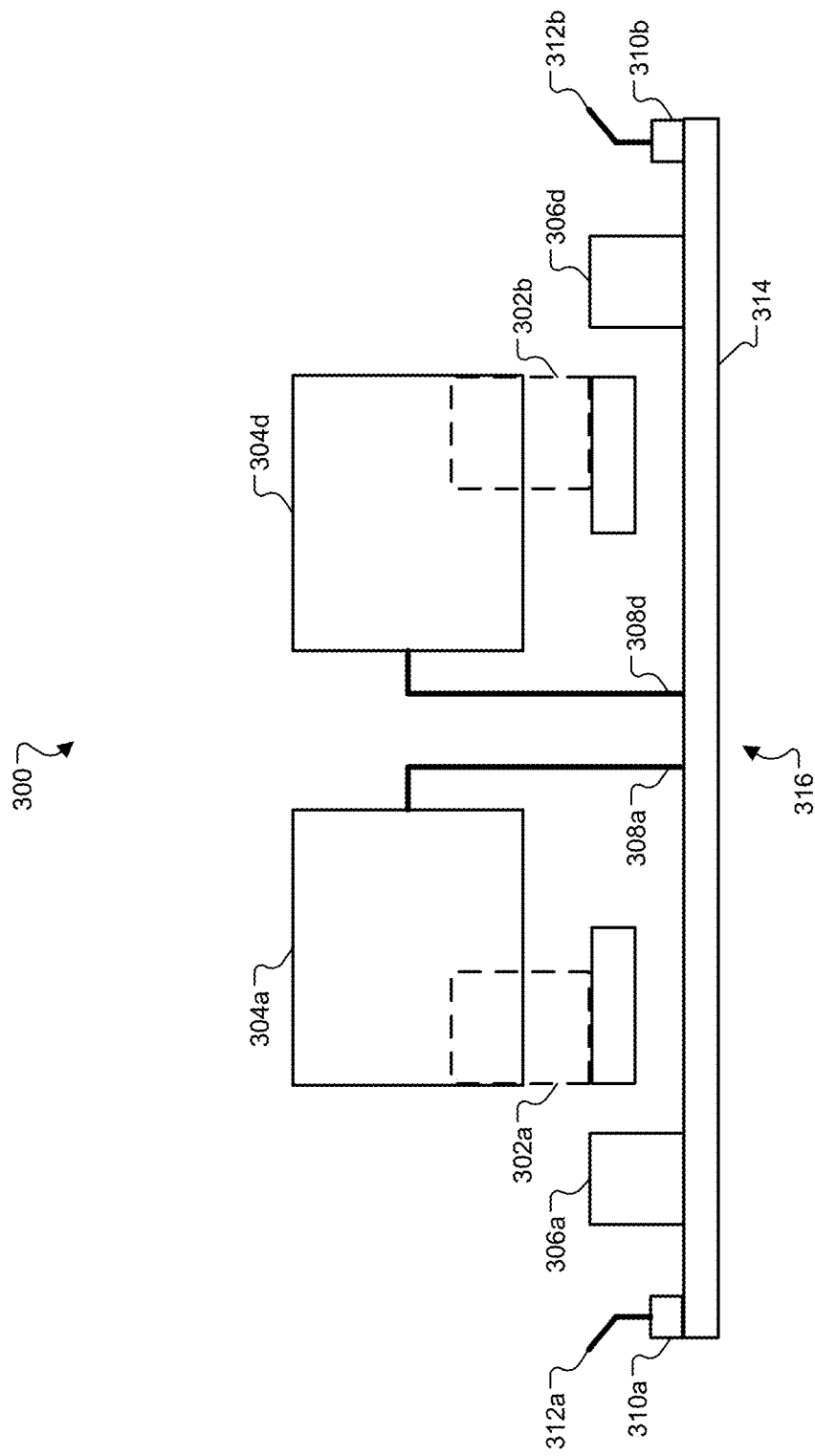
FIG. 3B is a cross sectional view of the example electrical panel.

FIG. 3B is a cross sectional view of the example electrical panel. The cross sectional view shows that the electrical panel includes a printed circuit board 314. The circuit breakers are mounted over the circuit board in two parallel columns of circuit breakers. Each relay is mounted on the circuit board in another column of relays parallel to a column of circuit breakers, so that each relay and circuit breaker pair forms a horizontal row.

The bus bars are mounted a certain distance from a center 316 of the panel so that the circuit breakers can be oriented towards the center of the panel and into a space between the bus bars. Each circuit breaker has one outside edge near a bus bar and an opposite outside edge near the center of the panel, where a wire 308a-f connects the circuit breaker to the printed circuit board. In some examples, the circuit breaker is connected directly to the printed circuit board. The printed circuit board, in turn, couples the wire to an input of the relay. The printed circuit board also couples an output of the relay to an exit pad 310a-b. An exit wire 132a-b is coupled to the exit pad. The exit wire is also coupled to a branch circuit outside the panel.

By placing the circuit breakers between the bus bars and oriented towards the center of the panel, other electrical components can be placed underneath the circuit breakers and mounted on the printed circuit board, and access to the relays outside the circuit breakers can be maintained. This is useful to reduce the size of the panel since components can be placed underneath the circuit breakers instead of next to the circuit breakers. A smaller panel can be less intrusive in a residence or other small space where a large panel is not desirable. Other examples of components that can be located under the circuit breakers include current sensing devices, voltage sensing devices, analog circuitry, circuit interruption relays, and microprocessors.

In operation, current flows into the panel from a main branch and into the bus bars. From the bus bars, current flows through the circuit breakers, then through the wires and the printed circuit board, then through the relays, then outside the panel to the branch circuits, and then back through a return path.

Each relay is coupled to a control system, e.g., a microcontroller, configured to individually control each of the relays. The control system can include a communications module, e.g., the communications module 264 of FIG. 2B. The control system can receive one or more instructions from a remote computer system over a data communications network and, in response, control one or more of the relays using the instructions. For example, the control system can cause one of the relays to open for, e.g., load curtailment, load testing, safety, or maintenance.

In some implementations, the panel includes a number of monitoring circuits, one for each branch circuit, each monitoring circuit being configured to monitor some aspect of the power drawn a branch circuit. The monitoring circuits can be coupled in series with the circuit breakers and relays. A monitoring circuit can be, e.g., a current detector implemented by a shunt circuit, or a voltage sensor. The monitoring circuits can be mounted on the printed circuit board underneath the circuit breakers.

The monitoring circuits are each coupled to the control system. The control system can receive and store monitoring information from each of the monitoring circuits. In some implementations, the control system is configured to report the monitoring information to a remote computer system over a data communications network.

Figure 4A:
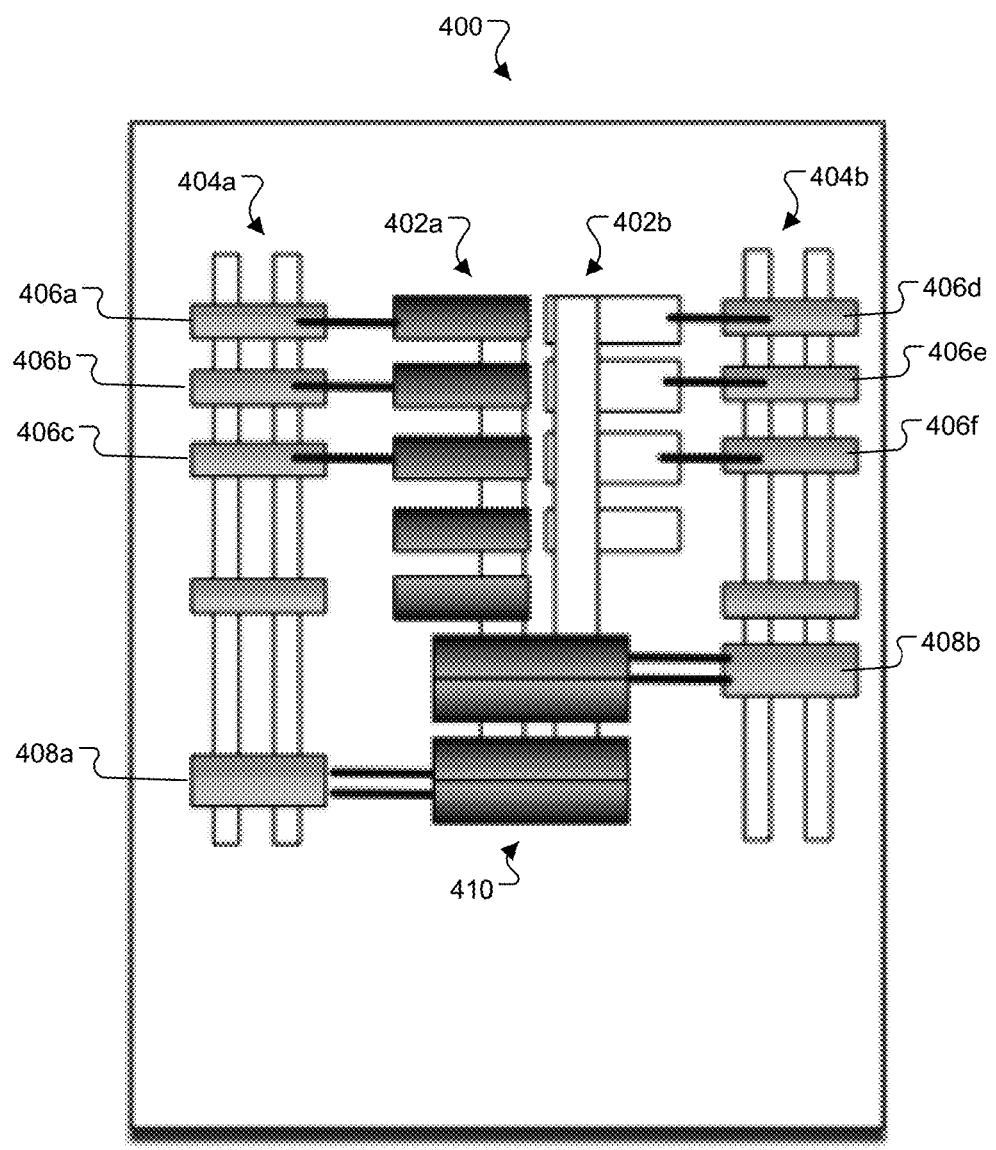
FIG. 4A is a block diagram of an example electrical panel that has been augmented to perform remote control and monitoring of branch circuits.

FIG. 4A is a block diagram of an example electrical panel 400 that has been augmented to perform remote control and monitoring of branch circuits. The panel includes a pair of columns of branch circuit breakers 402a-b mounted on bus bars. In some examples, the branch circuit breakers are coupled to a pair of double pole breakers 410. In some examples, the branch circuit breakers can be coupled to main circuit breakers (not shown).

The panel includes a pair of DIN rails 404a-b configured to host a number of remote operability devices 406a-f, one for each branch circuit breaker. In some examples, two or more remote operability devices are coupled to one or more branch circuit breakers. The DIN rails are illustrated as pairs of vertical bars for purposes of illustration; however, typically DIN rails do not have multiple bars.

The remote operability devices 406a-f can be the remote operability devices 266 of FIG. 2B. Each remote operability device is coupled to a control system, e.g., by a wired or wireless communications link. The control system can individually control each of the remote operability devices and receive monitoring information from each of the remote operability devices.

Figure 4B:
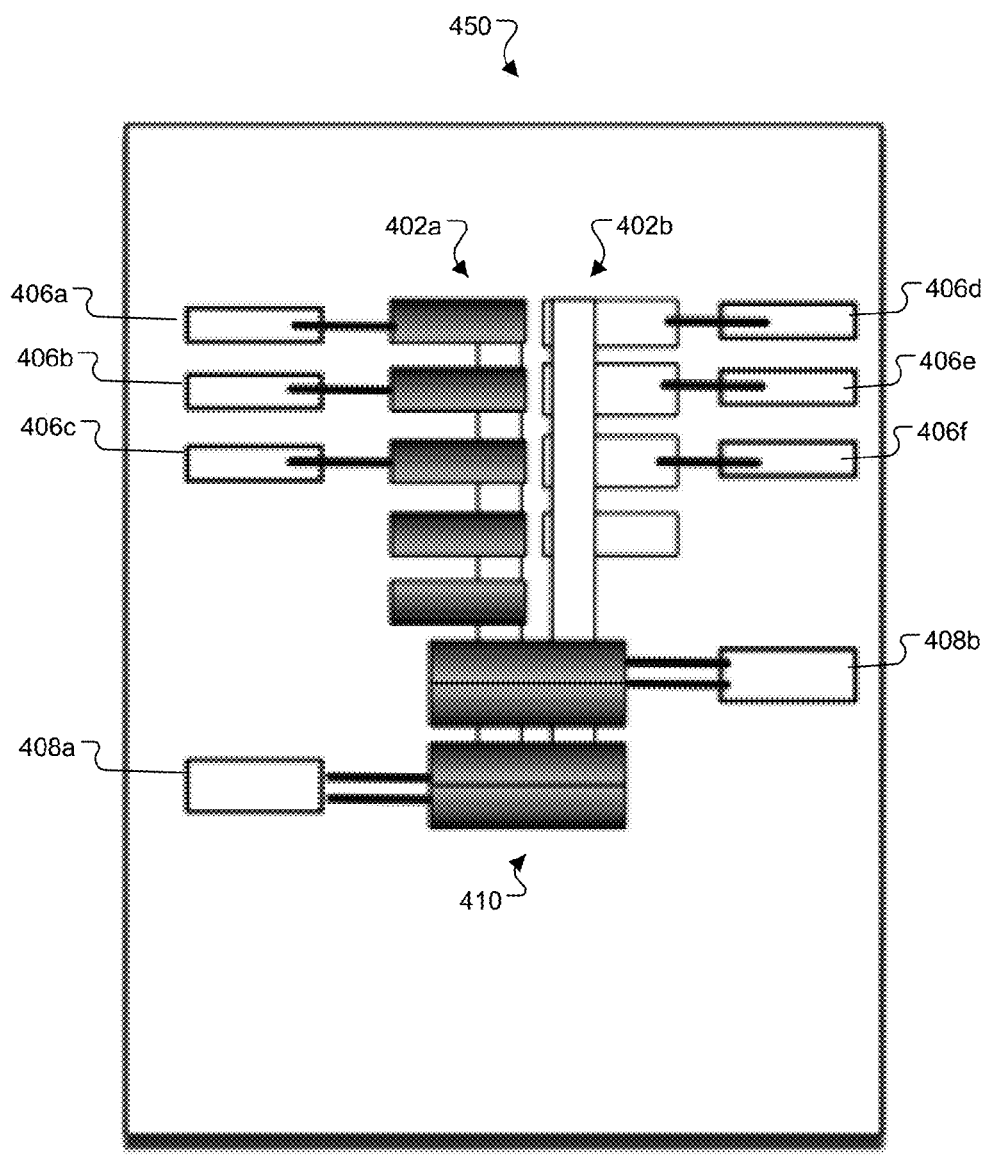
FIG. 4B is a block diagram of another example electrical panel that has been augmented to perform remote control and monitoring of branch circuits.

FIG. 4B is a block diagram of another example electrical panel 450 that has been augmented to perform remote control and monitoring of branch circuits. The panel lacks the DIN rails of the example panel 400 of FIG. 4A. The remote operability devices are electrically connected to the circuit breakers, but instead of being coupled to DIN rails, the remote operability devices can be left hanging in the panel and not physically secured to the housing by anything other than the wires used to create the electrical connections.

Figure 5A:
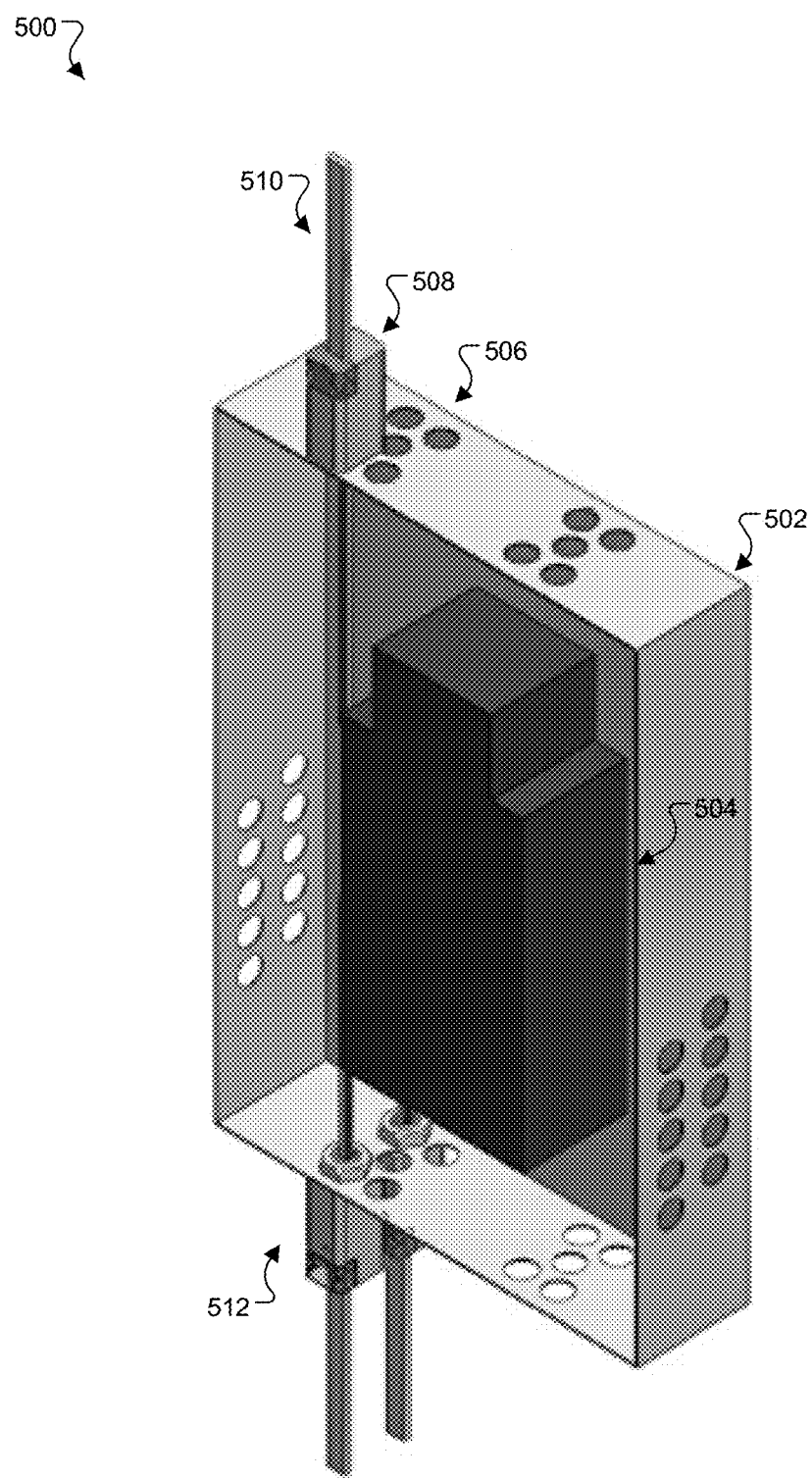
FIG. 5A is a cutout view of an example electrical panel that has been augmented to perform remote control and monitoring of branch circuits by remote operability devices and installed outside of a housing of the panel.

FIG. 5A is a cutout view of an example electrical panel 500 that has been augmented to perform remote control and monitoring of branch circuits by remote operability devices 508 and 512 installed outside of a housing 502 of the panel. For example, the remote operability devices 508 and 512 can be the remote operability devices 266 of FIG. 2B. The panel includes circuit breakers 504, configured to provide overcurrent protection, inside the housing. The panel includes holes ("knockouts") 506 through the housing. A sheathed electrical cable 510 electrically couples the circuit breakers inside the housing to the remote operability devices.

Figure 5B:
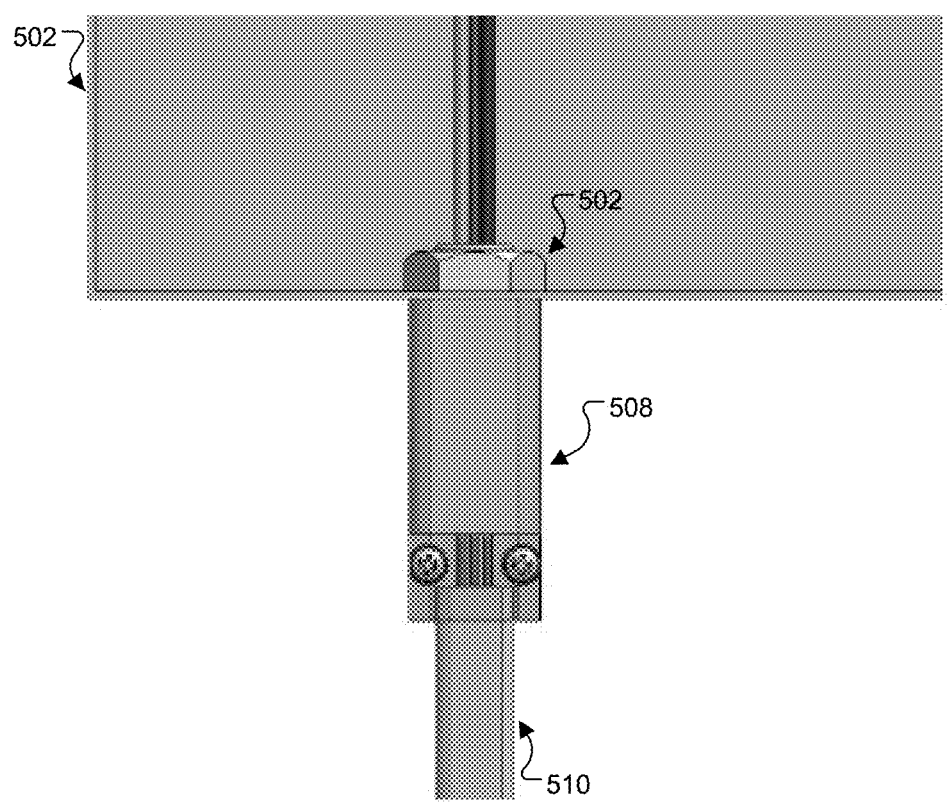
FIG. 5B is a close up view of a remote operability device mounted on the outside of the housing of the panel.

FIG. 5B is a close up view of a remote operability device 508 mounted on the outside of the housing 502 of the panel. The remote operability device can be mounted to the housing through the knockout by a locknut, spring retention clip, retaining ring, or other positive retaining means. The sheathed branch circuit cable can be split so that the individual exposed conductors can be fed into the remote operability device. The remote operability device may have conductors molded in (e.g. pre-attached) that allow connection to overcurrent protection devices (e.g. circuit breakers) or it may have provisions for field wiring conductors. The remote operability device may have provisions for one or multiple branch circuit cables (each including multiple conductors).

Figure 6:
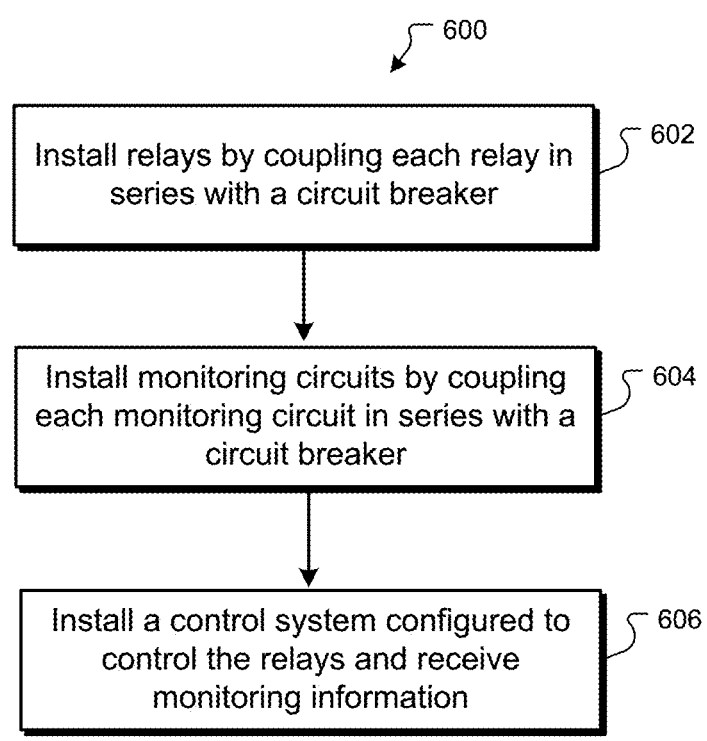
FIG. 6 is a flow diagram of an example process for augmenting an electrical panel for remote control and monitoring.

FIG. 6 is a flow diagram of an example process 600 for augmenting an electrical panel for remote control and monitoring. Relays and monitoring circuits are installed in series with each of the circuit breakers in the panel (602 and 604). For example, remote operability devices can be installed inside a housing of the panel as shown in FIGS. 4A-B or outside the housing of the panel as shown in FIGS. 5A-B. A control system is installed and configured to control the relays and receive monitoring information. The control system can include a communications module, e.g., the communications module 264 of FIG. 2B, to receive instructions and send monitoring information to a remote computer system over a data communications network.

Figure 7:
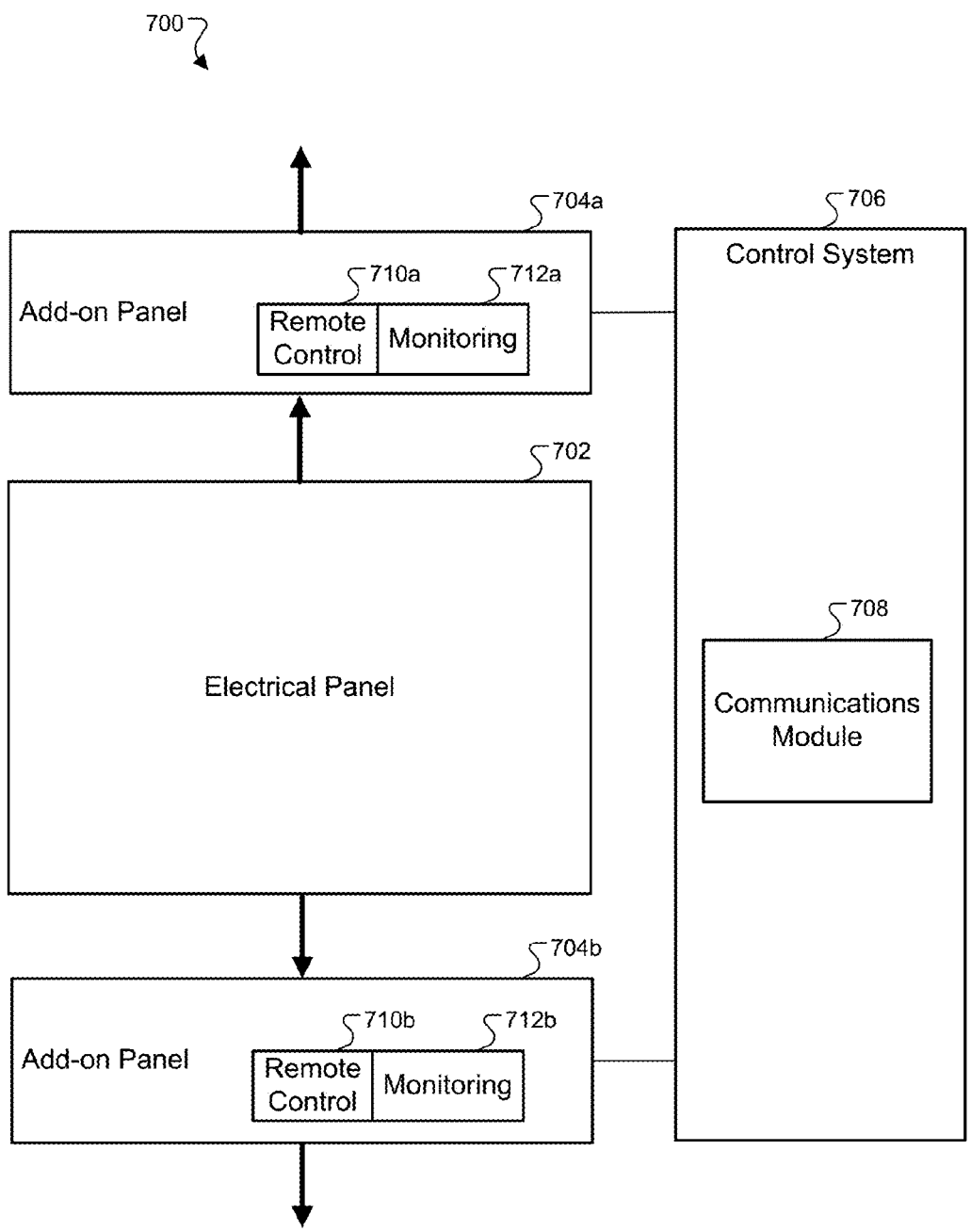
FIG. 7 is a block diagram of a system including an electrical panel and two add-on panels.

FIG. 7 is a block diagram of a system 700 including an electrical panel 702 and two add-on panels 704a-b. The electrical panel includes circuit breakers configured to provide overcurrent protection to branch circuits. The add-on panels each include remote control modules 710a-b and/or a remote monitoring modules 712a-b that are coupled in series with circuit breakers of the electrical panel. The add-on panels are coupled to a control system 706, e.g., a microcontroller, that is configured to individually control the remote control modules and receive monitoring information from the monitoring modules.

The control system includes a communications module 708 configured to communicate over a data communications network. The control system can receive instructions from or report monitoring information to a remote system over the data communications network. In some implementations, the control system stores monitoring information locally on a computer readable medium.

Figure 8:
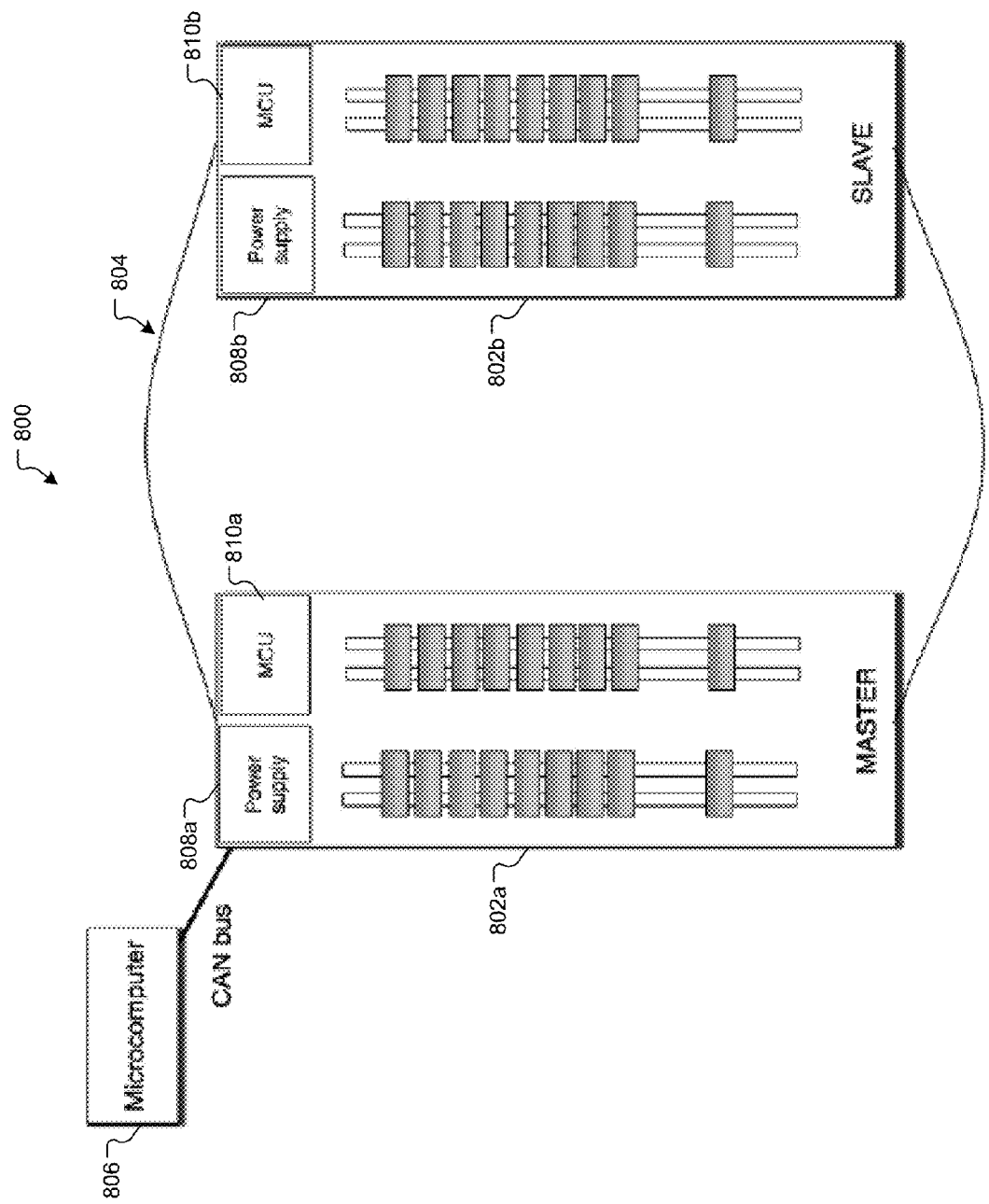
FIG. 8 is a block diagram of a system including two add-on panels and in communication over a data communications network.

FIG. 8 is a block diagram of a system 800 including two add-on panels 802a and 802b in communication over a data communications network, e.g., a controller area network (CAN) bus 804. In some examples, the data communications network includes wireless protocols such as 802.11, 802.15.4, or ZigBee. Each add-on panel includes a power supply 808a-b and a microcontroller 810a-b. The two add-on panels are in a master-slave relationship on the CAN bus. The master add-on panel 802a is in communication with the control system 806, illustrated as a microcomputer. The control system can send an instruction to the slave add-on panel 802b by sending the instruction first to the master add-on panel 802a, which, in turn, relays the instruction to the slave add-on panel 802b. In some examples, the power supply 808a-b are modular.

The processes and logic flows described in this specification can be performed by one or more programmable devices programmed to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. For example, the subject matter is described in context of scientific papers. The subject matter can apply to other indexed work that adds depth aspect to a search. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing can be advantageous.

What is claimed is:

1. An electrical panel comprising:
a housing comprising an input for coupling to an electrical grid and a plurality of outputs for coupling to a plurality of branch circuits;
a pair of parallel bus bars connected to the housing;
a plurality of circuit breakers inside the housing, one for each branch circuit, wherein each circuit breaker is configured to provide overcurrent protection for the circuit breaker's branch circuit, and wherein each circuit breaker is coupled to one of the bus bars;
a plurality of remote operability devices inside the housing, one for each circuit breaker, wherein each remote operability device is coupled in series with a respective circuit breaker;
a control system coupled to each of the remote operability devices and configured to individually control each of the remote operability devices; and
a printed circuit board inside the housing, wherein a first plurality of circuit breakers are organized into a first column over the printed circuit board, and wherein the respective remote operability device of each of the first plurality of circuit breakers is mounted on the printed circuit board in a second column parallel to the first column so that each circuit breaker of the first plurality of circuit breakers forms a row with the circuit breaker's respective remote operability device.

2. The electrical panel of claim 1, wherein the plurality of remote operability devices include one or more relays.

3. The electrical panel of claim 1, comprising a plurality of additional electrical components mounted on the printed circuit board underneath the circuit breakers.

4. The electrical panel of claim 1, comprising a plurality of monitoring circuits, at least one for each branch circuit, each monitoring circuit being coupled in series with a respective remote operability device and a respective circuit breaker, each monitoring circuit being configured to monitor at least one aspect of the power drawn by the monitoring circuit's respective branch circuit.

5. The electrical panel of claim 4, wherein the control system is coupled to each of the monitoring circuits and is configured to receive and store monitoring information from each of the monitoring circuits.

6. The electrical panel of claim 4, wherein the control system comprises a communications module configured to communicate on a data communications network, and wherein the control system is coupled to each of the monitoring circuits and is configured to receive respective monitoring information from each of the monitoring circuits and report the monitoring information to a remote computer system over the data communications network.

7. A method for augmenting an electrical panel comprising a housing and a plurality of circuit breakers inside the housing, one for each of a plurality of branch circuits, wherein each circuit breaker is configured to provide overcurrent protection for the circuit breaker's branch circuit, the method comprising:
installing a printed circuit board for the electrical panel, wherein a first plurality of circuit breakers are mounted into a first column over the printed circuit board;
installing a plurality of remote operability devices for the electrical panel, one remote operability device for each branch circuit, including coupling each remote operability device in series with a respective circuit breaker, wherein the respective remote operability device of each of the first plurality of circuit breakers is mounted on the printed circuit board in a second column parallel to the first column so that each circuit breaker of the first plurality of circuit breakers forms a row with the circuit breaker's respective remote operability device;
installing a plurality of monitoring circuits for the electrical panel, one for each branch circuit, including coupling each monitoring circuit in series with a respective circuit breaker, each monitoring circuit being configured to monitor at least one aspect of the power drawn by the monitoring circuit's respective branch circuit; and
installing a control system for the electrical panel, including coupling the control system to each of the remote operability devices and each of the monitoring circuits so that the control system is configured to individually control each of the remote operability devices and receive respective monitoring information from each of the monitoring circuits.

8. The method of claim 7, wherein installing the remote operability devices comprises:
installing a DIN rail; and
installing at least a first plurality of remote operability devices in parallel along the DIN rail.

9. The method of claim 7, wherein installing the remote operability devices comprises installing at least a first plurality of remote operability devices by wiring the remote operability devices to respective circuit breakers without physically attaching the remote operability devices to the housing.

10. The method of claim 7, wherein installing the remote operability devices comprises installing at least a first plurality of remote operability devices on the outside of the housing.

11. The method of claim 10, wherein the housing comprises a plurality of knockouts, and wherein installing the first plurality of remote operability devices on the outside of the housing comprises wiring the remote operability devices through the knockouts.

12. The method of claim 7, wherein the control system comprises a communications module configured to communicate over a data communications network, and wherein installing the control system comprises configuring the control system to report the monitoring information to a remote computer system over the data communications network.

13. A system comprising:
an electrical panel comprising a housing and a plurality of circuit breakers inside the housing, one for each of a plurality of branch circuits, wherein each circuit breaker is configured to provide overcurrent protection for the circuit breaker's respective branch circuit;
an add-on panel comprising:
a plurality of remote operability devices, one for each branch circuit of a subset of the plurality of branch circuits, wherein each remote operability device in the add-on panel is coupled in series with a respective circuit breaker in the electrical panel; and a plurality of monitoring circuits, at least one for each branch circuit of the subset of the plurality of branch circuits, wherein each monitoring circuit in the add-on panel is coupled in series with a respective circuit breaker, each monitoring circuit being configured to monitor at least one aspect of the power drawn by the monitoring circuit's respective branch circuit;

a control system coupled to the add-on panel and configured to individually control each of the remote operability devices and receive respective monitoring information from each of the monitoring circuits; and a printed circuit board inside the housing, wherein a first plurality of circuit breakers are organized into a first column over the printed circuit board, and wherein the respective remote operability device of each of the first plurality of circuit breakers is mounted on the printed circuit board in a second column parallel to the first column, so that each circuit breaker of the first plurality of circuit breakers forms a row with the circuit breaker's respective remote operability device.

14. The system of claim 13, wherein the control system comprises a communications module configured to communicate on a data communications network.

15. The system of claim 14, wherein the control system is configured to report the monitoring information to a remote computer system over the data communications network.

16. The system of claim 14, wherein the control system is configured to receive one or more instructions from a remote computer system over the data communications network and, in response, control one or more of the remote operability devices using the instructions.

17. The system of claim 13, comprising an additional add-on panel, wherein the add-on panel is coupled to the additional add-on panel by a communications link, and wherein the control system is configured to send one or more instructions to the additional add-on panel by sending the instructions to the add-on panel which, in turn, remote operability devices the instructions to the additional add-on panel over the communications link.

18. The system of claim 17, wherein the add-on panel comprises a microcontroller configured, by executing communications software, to relay the instructions over the communications link using a data communications network, and wherein the electrical panel and the additional electrical panel are in a master/slave relationship.

* * * * *